United States Patent [19]
Itoh

[11] Patent Number: 6,013,575
[45] Date of Patent: *Jan. 11, 2000

[54] METHOD OF SELECTIVELY DEPOSITING A METAL FILM

[75] Inventor: Hitoshi Itoh, Tokyo, Japan

[73] Assignee: Kabushiki Kaisha Toshiba, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/674,812

[22] Filed: Jul. 3, 1996

[30] Foreign Application Priority Data

Jul. 7, 1995 [JP] Japan ................................. 7-172480

[51] Int. Cl.⁷ .............................................. H01L 21/4763
[52] U.S. Cl. ........................... 438/641; 438/674; 438/675
[58] Field of Search ..................... 437/192, 203, 437/198; 438/674, 641, 675

[56] References Cited

U.S. PATENT DOCUMENTS

| | | | |
|---|---|---|---|
| 4,983,543 | 1/1991 | Sato et al. | 438/641 |
| 5,037,775 | 8/1991 | Reisman | 437/192 |
| 5,043,299 | 8/1991 | Chang et al. | 438/674 |
| 5,071,789 | 12/1991 | Nakata | 438/641 |
| 5,112,439 | 5/1992 | Reisman et al. | 156/656 |
| 5,223,455 | 6/1993 | Itoh et al. | |
| 5,607,878 | 3/1997 | Otsuka et al. | 438/641 |
| 5,620,925 | 4/1997 | Nakata et al. | 438/641 |
| 5,654,237 | 8/1997 | Suguro et al. | 438/641 |

FOREIGN PATENT DOCUMENTS

| | | |
|---|---|---|
| 60-91631 | 5/1985 | Japan . |
| 1-201938 | 8/1989 | Japan . |
| 2-38568 | 2/1990 | Japan . |

OTHER PUBLICATIONS

Hitoshi Itoh et al., "Mechanism for Initial Stage of Selective Tungsten Growth Employing a WF$_6$ and SiH$_4$ Mixture," Japanese Journal of Applied Physics, vol. 30, No. 7, Jul. 1991, pp. 1525–1529.

*Primary Examiner*—John F. Niebling
*Assistant Examiner*—Lynne A. Gurley
*Attorney, Agent, or Firm*—Finnegan, Henderson, Farabow, Garrett & Dunner, L.L.P.

[57] ABSTRACT

The present invention provides a method of selectively depositing a metal film in an opening of an insulating layer formed on a semiconductor substrate, the opening exposing a surface of at least one of a metal layer, a semiconductor layer, and a semiconductor substrate, the method including the steps of exposing a surface of insulating layer and the substrate surface to a gas plasma which consists of at least one of an inert gas and hydrogen, exposing the insulating layer to a gas containing halogen atoms other than fluorine atoms, and selectively depositing a metal film in the opening of the insulating layer.

9 Claims, 14 Drawing Sheets

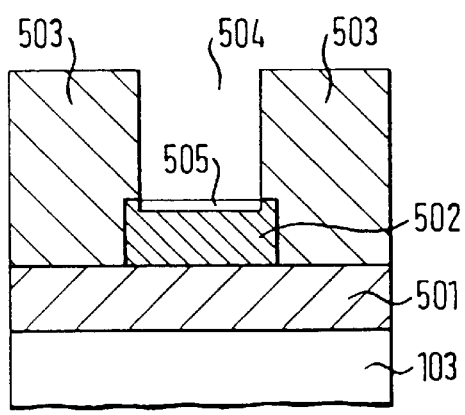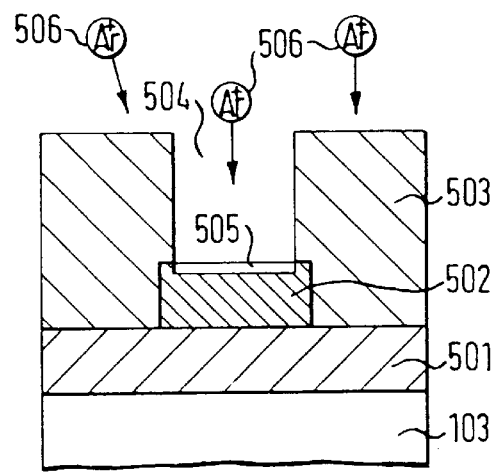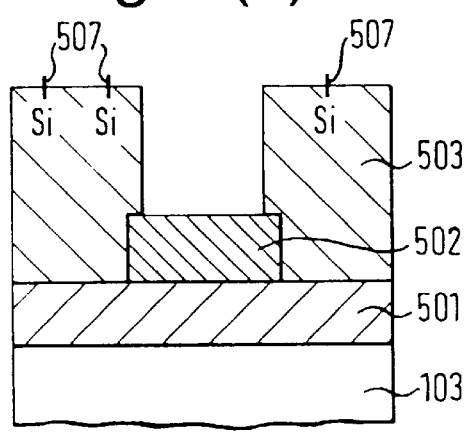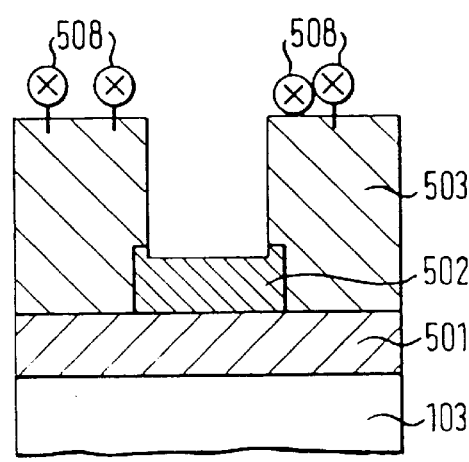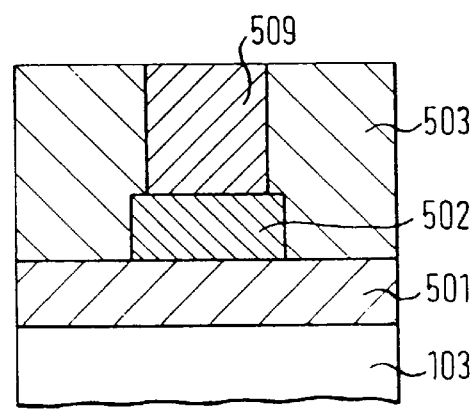

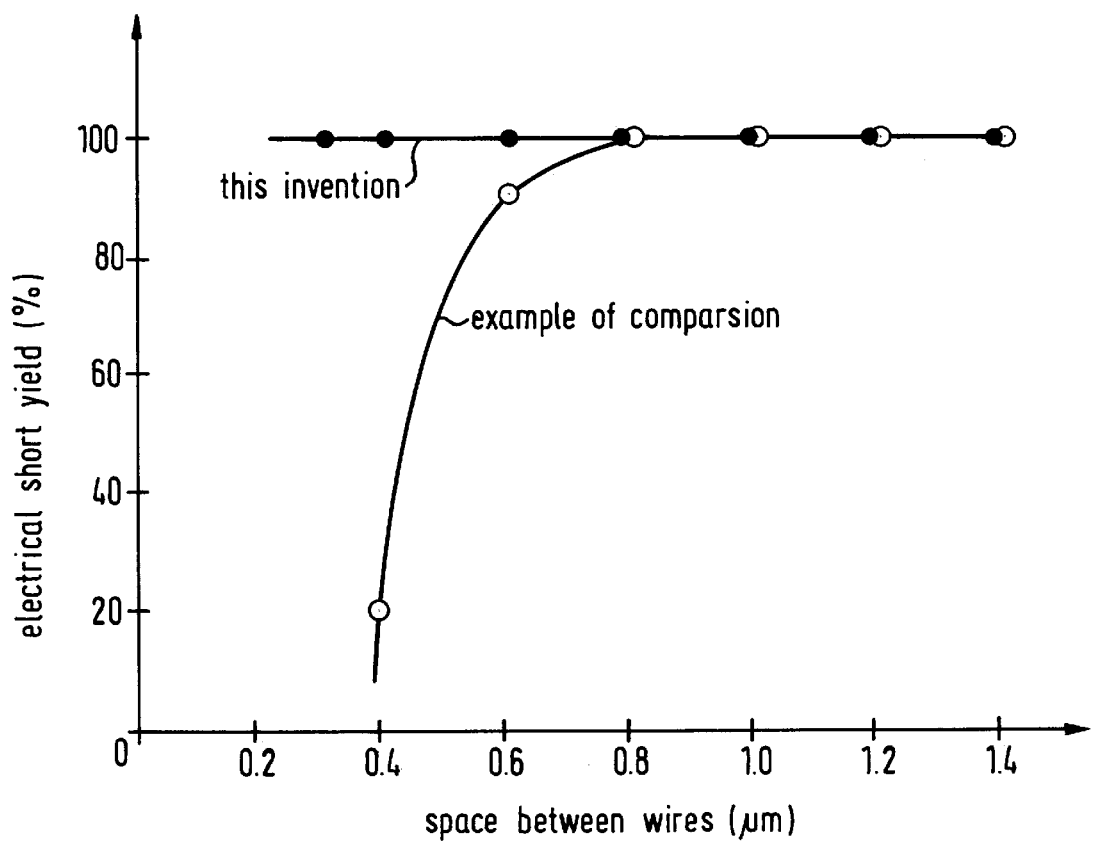

METHOD OF SELECTIVELY DEPOSITING A METAL FILM

BACKGROUND OF THE INVENTION

This invention relates to a method of selectively depositing a metal film, and especially relates to the method realizing good electric contact with an underlying layer of the metal film and high selectivity of growth of the metal film.

High integration of semiconductor devices has been brought by miniaturizing composition elements such devices. However, in the manufacture process of semiconductor devices, various problems which are shown below have occurred. In wiring processes, for example, wiring widths have become small by reduction of a design rule in accordance with miniaturizing and the aspect ratio of contact hole (depth of contact hole/width of contact hole) for connecting an upper wiring layer and a lower wiring layer has been increased. For this reason, when forming an Al—Si—Cu alloy layer in a contact hole by using the usual sputtering method, it has become difficult to form a reliable wiring, because the wiring is either cracked or broken down in the bottom of the contact hole.

As a method of solving the problem resulting from the high aspect ratio of such contact hole, some methods propose forming wiring material by embedding the contact hole with conductive material and thereafter making it flat. As one of the methods, a selective chemical-vapor-deposition (CVD) technology which selectively forms a metal film such as tungsten (W) only in the contact is known. This technology is remarkable because a metal film can be grown up from the bottom of a contact hole, even if the contact hole is deep.

The selective CVD technology is precisely explained below.

An insulating film is formed on a semiconductor substrate, and if a contact hole for taking electric connection is opened by reactive-ion-etching (RIE), the RIE damage layer will form on the bottom of the contact hole. The reason why that this RIE damage layer is formed is as follows.

After applying a resist and transferring a desired pattern on the insulating film by the optical exposing method, an opening of the contact hole with use of a RIE method is performed by etching the regions of the insulating film not protected by the resist. For example, if the insulating film is in the case of a silicon oxide, an etching is performed using the compound gas including fluorine atoms such as $CF_4$.

As plasma is used at this RIE process, electric or ion particles put onto the substrate. The residual object of CH system produced from the resist, and F or C driven from the plasma gas remain in the bottom of the contact hole. Furthermore, the resist that remained in the substrate surface is removed after opening the contact hole. Removing the resist is usually carried out by an electric discharge using an oxygen gas for ashing the resist with use of oxygen radical (O*). The bottom of the contact hole also oxidizes in this ashing-process. Therefore, the RIE damage layer is formed from RIE process and ashing process.

If RIE damage layer exists on the bottom of the contact hole, the metal film formed by the selective CVD method does not grow because the RIE damage layer may work as an insulating film. Therefore, the RIE damage layer needs to be removed before growth of the metal film.

There is a method of removing RIE damage layer by wet chemistry processing of rare hydrogen fluoride etc. After the wet chemistry processing, however, a substrate is washed by pure water and is dried in $N_2$ atmosphere and is usually conveyed with exposure to the atmosphere to the apparatus for perform selection CVD. Therefore, a natural oxide layer grows to the surface of the substrate again in the process which is conveyed in the atmosphere, even though a pure metal surface or a pure semiconductor surface is exposed by the wet chemistry processing. In situations where that the natural oxide layer exists, an electrical property will be change for the worse since a metal film is grown through the natural oxide. Therefore, the method by wet chemistry processing has not resulted in practical use.

Thus, after removing RIE damage layer and exposing it the pure surfaces, a metal film must be formed on the pure surface without exposing to the atmosphere.

One example of such method is indicated in Japanese Patent Disclosure (kokai) No. 60-91631 (prior art 1). According to the method W is selectively formed after exposing to a gas plasma so as to remove RIE damage layer. The method is especially effective if the sputtering to the RIE damage layer with Ar ion generated from electric discharge of Ar gas is carried out.

However, the sputtering is carried out not only against the bottom of the contact hole but against the surface of the silicon oxide. The sputtering is the phenomenon that atoms with light atomic weight are firstly sputtered (selective sputtering). In the case of the silicon oxide layer an oxygen atom (O) is firstly sputtered, and at the surface after sputtering surplus silicon atoms which are not proper chemical amount of atoms are formed. This surplus Si forms a dangling bond and the selective deposition of a metal film cannot be realized.

The mechanism of the selective deposition of W film which is one of the metal films is shown in Ito et al. "Japanese Journal of Applied Phisics, 30 No. 7, page 1525–1529 (1991)" (prior art 2).

Namely, the essence of a selective deposition is that electrons move to WF6 absorbed from the surface of the substrate and start absorption and dissociating and thereby a seed layer is formed. The dangling bond of Si atom has a non-pair electron and tends to serve as an electronic grant object and therefore W is grown on the surface. For this reason, it is difficult to carry out the selective deposition of W film by the method of Japanese Patent Disclosure (kokai) No. 60-91631.

In view of this situation, a method of terminating the dangling bond produced on an insulating film is proposed in Japanese Patent Disclosure (kokai) No. 2-38568 (prior art 3). In this method, after a plasma etching of the processed substrate surface is carried out by Ar gas and so on, for clean up, a substrate exposed to a desired gas atmosphere and the dangling bond is terminated by O, N, F, or OH. Therefore, a good metal film is formed.

Moreover, a method of selective deposition of a metal film after etching a opening part of a contact hole formed in an almina film or $SiO_2$ layer with use of gas plasma including chlorine such as $BCl_3$ is also proposed in Japanese Patent Disclosure (kokai) No. 1-201938.

According to this method, since the insulating film formed at the surface of the contact hole can be removed without damaging the surface of the alumina film or $SiO_2$ layer by using gas including chlorine, it is possible to reduce a contact resistance at the contact hole.

However, it has became clear to inventors that it is difficult to obtain the high selectivity and a good metal film even if these methods implement selective CVD.

SUMMARY OF THE INVENTION

This invention, to solve the problems described above, realizes good electric contact between a metal film formed by a selective CVD and underlying portion, such as Si substrate at the bottom of the contact hole formed in the insulating film and also provides a high selectivity of the metal film against the insulating film.

The present invention provides a method of selectively depositing a metal film in an opening of an insulating layer formed on a semiconductor substrate, the opening exposing a surface of at least one of a metal layer, a semiconductor layer, and the semiconductor substrate, the method comprising the step of exposing a surface of insulating layer and the surface exposed by the opening to a gas plasma consisting of at least one of an inert gas and hydrogen; exposing the insulating layer to a gas containing halogen atoms other than fluorine atoms; and selectively depositing a metal film in the opening of the insulating layer.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

FIG. 6 is the sectional view showing selective formation process of W film concerning the 1st Example of this invention.

FIG. 8 is the characteristic figure showing wiring short yield of 1st layer Al which shows effect of the 1st Example of this invention.

DESCRIPTION OF THE PREFERRED EMBODIMENTS

Before describing the preferred embodiments according to the method of this invention, a considerable analysis to the mechanism intended will be explained below first.

As mentioned above, after a contact hole is formed in an insulating film by RIE using a photo resist pattern as a mask and thereafter the photograph resist pattern is ashed with oxygen plasma etc, RIE damage layer or oxide layer of underlying portion are produced in the bottom of the contact hole.

In this state, when a substrate is exposed to a plasma atmosphere of inactive gas or hydrogen gas, RIE damage layer in the bottom of the contact hole and the oxide layer of the undering portion are removed by sputtering effect or chemical reaction of ions or radicals produced from the plasma. At this time the surface of the insulating film is also etched to become active. Especially when the sputtering effect is strong, the surface of the insulating film becomes silicon (Si) rich and has many dangling bonds existing.

Next, when exposing this substrate to the gas atmosphere of non-plasma including halogen atoms excluding fluorine, the surface of the insulating film is terminated with the compounds including the halogen atoms or decomposition objects of the compounds. Halogen atoms are easily and firmly combined with the surface on which the dangling bonds exist.

Because on the bottom of the contact hole from which RIE damage layer and the oxide layer were removed dangling bonds does not exist, the compound including halogen atoms exists in the state where physical absorption is weakly.

After processing the substrate in accordance with the above procedures, a metal film, such as W film is formed by CVD with use of WF6 and SiH4 as material gas. The absorption of WF6 and SiH4 to the insulating film is controlled by the compound which contains the halogen atoms terminated or the halogen atoms on the insulating film and deposition of W particle on the insulating film is suppressed. As such, a substitution reaction between WF6 and the compound containing the halogen atom which is physically absorbed is advanced and W is grown, with a high selectivity at the bottom of the contact hole.

The mechanism of high selective CVD of the metal film according to the present invention can be explained by the inventors on the basis of following consideration and knowledge.

First, a model containing dangling bonds of $Si_7$ that are terminated by chlorine (Cl) is considered here. The stabilization energy of Cl—Si model (based on this invention) with dangling bonds of Si being terminated by chlorine (Cl) atoms and the stabilization energy of the F—Si model (based on the prior art) dangling bonds of Si being terminated by fluorine (F) atoms when WF6 is supplied to the models is respectively calculated.

Figure 1A:
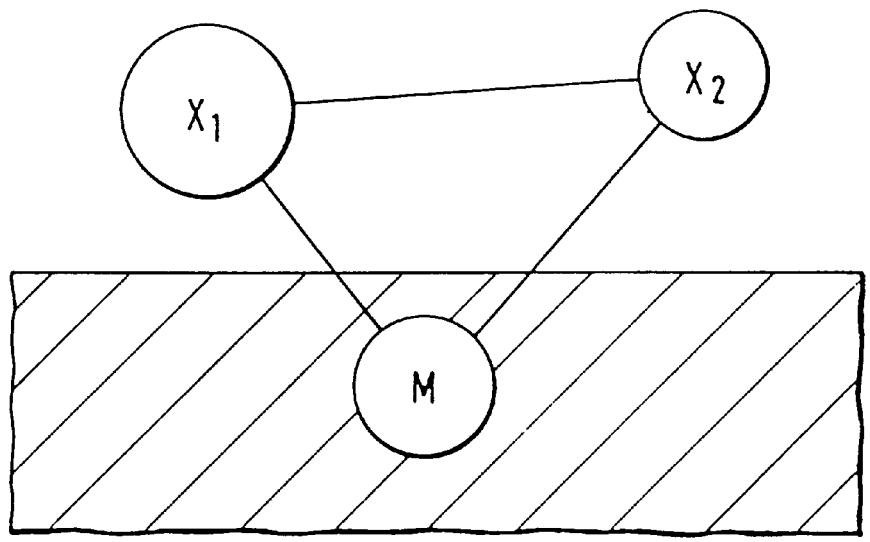
FIG. 1 is the plane outline figure and characteristic figure for explaining principle of this invention.

FIG. 1(a) shows an arrangement when molecule x2 approaches a to an system of atom x1 which is terminated with substrate atom M.

In FIG. 1(a) atom M is silicon (Si), molecule X2 is WF6 and atom X1 is either chlorine or fluorine. A symbol "Cl—Si—F" is used in the case of X1 being chlorine and a symbol "F—Si—F" is used in the case of X1 being fluorine hereinafter. WF6 is represented with F atom in the symbols. This is why W atom is positioned at the center of an octahedron molecule structure and fluorine (F) atoms are respectively positioned at opexes of the octahedron, therefore fluorine first give a mutual action when it approach to the Cl—Si or F—Si.

In addition, since energy data on the substrate surface of the system of Cl—Si—F (x1=Cl, x2=WF6, and M=Si) and F—Si—F (x1=F, x2=WF6, and M=Si) can not be found out, constant of SiCl, SiF, ClF, and F2 in gas phase is used for calculating the combination coefficient of Si—Cl, Si—F, Cl—F, and F—F. The data was quoted from JANF Thermo Table (Horikoshi research institute). Moreover, Morse potential was assumed to Si—Cl, Si—F, Cl—F, and F—F, and the energy of whole system was calculated as total energy of each combination.

Figure 1B:
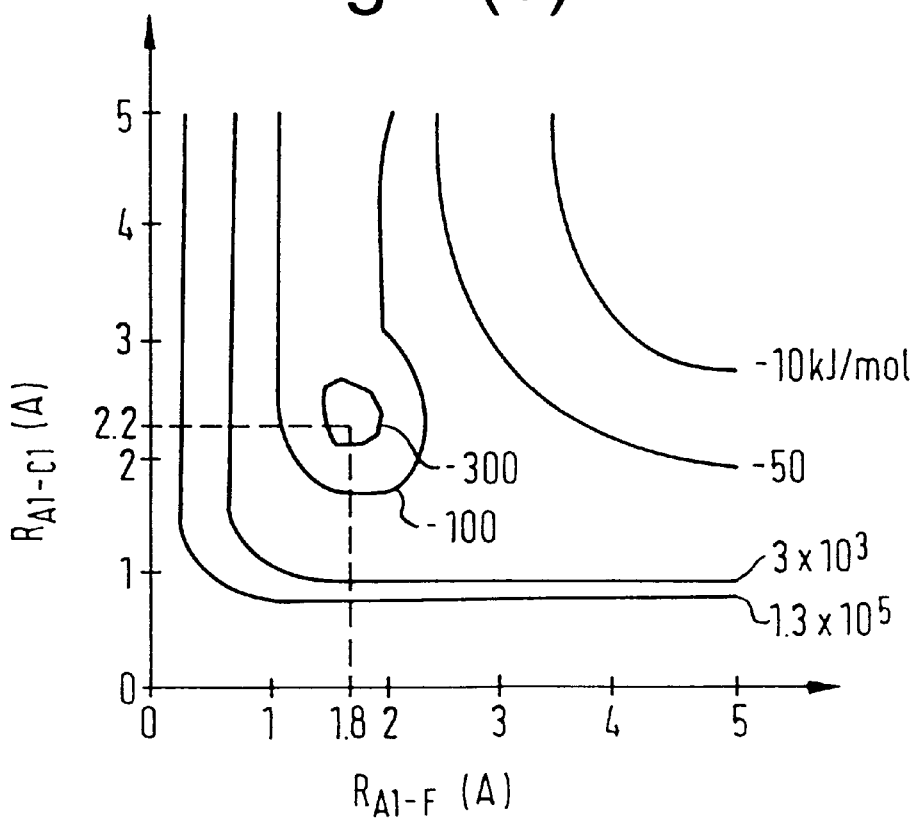

As an example, the potential energy of the system of Cl—Al—F system (x1=Cl, x2=WF6, and M=Al) is shown in FIG. 1(b). A horizontal axis $R_{Al-F}$ is a distance of Al—F and a vertical axis $R_{Al-Cl}$ is a distance of Al—Cl. Each line in FIG. 1(b) shows the potential energy being equal. It is understood from FIG. 1(b) that there is a valley where the energy becomes minimum, when R(Al—F) is about 1.8 A and R(Al—Cl) is a about 2.2 A.

Figure 2:
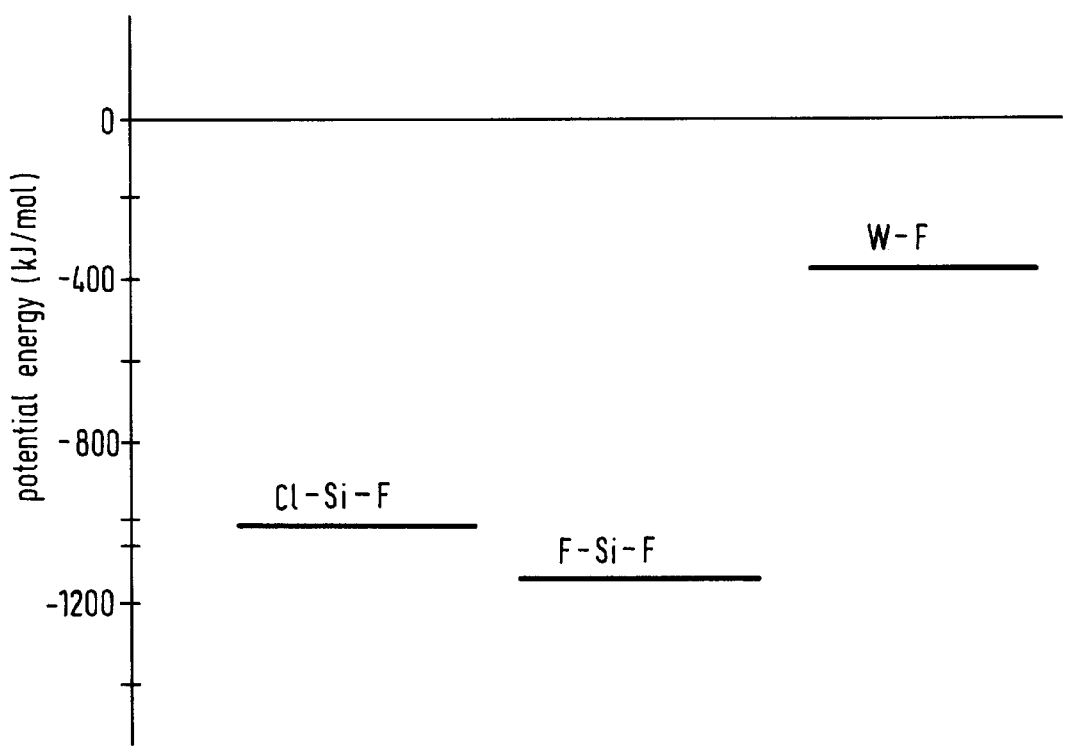
FIG. 2 is the plane outline figure for explaining principle of this invention.

FIG. 2 shows potential energy of Cl—Si—F system (x1=Cl, x2=WF6, and M=Si) and F—Si—F system (x1=F, x2=WF6, and M=Si). In addition, the energy of W—F is also shown for comparison in FIG. 2.

Apparent from FIG. 2, F—Si—F system is easy to react with WF6 rather than Cl—Si—F system. That is, when dangling bonds of Si are terminated with F, W tends to easily grow up, compared from Cl. This explanation corresponds with experiment result which is described in a following embodiment.

Next, a method of forming a metal film according to this invention being superior to the method indicated in the prior art 3 will be explained below.

In order to remove RIE damage layer at the bottom of the contact hole, BCl3 RIE is used. The BCl3 RIE is carried out for 60 to 120 seconds in condition 100 SCCM, the pressure of 0.5 Pa, and RF output 100 W. However, chlorine and boron remain at the bottom of the contact hole and W does not grow up. Therefore, after heat-treatment for a substrate at the temperature of 200 to 400° C. and removing of chlorine on the surface the metal, W is formed.

In order to investigate the relation of the heat-treatment the temperature and the amount of chlorine which remain in the bottom of the contact, Al alloy film is formed all over a substrate and is etched by RIE using BCl3. 300 seconds of heat-treatment for various temperature was carried out. The amount of remaining Cl by atomic absorption spectophotometry is shown in FIG. 3.

Figure 3:
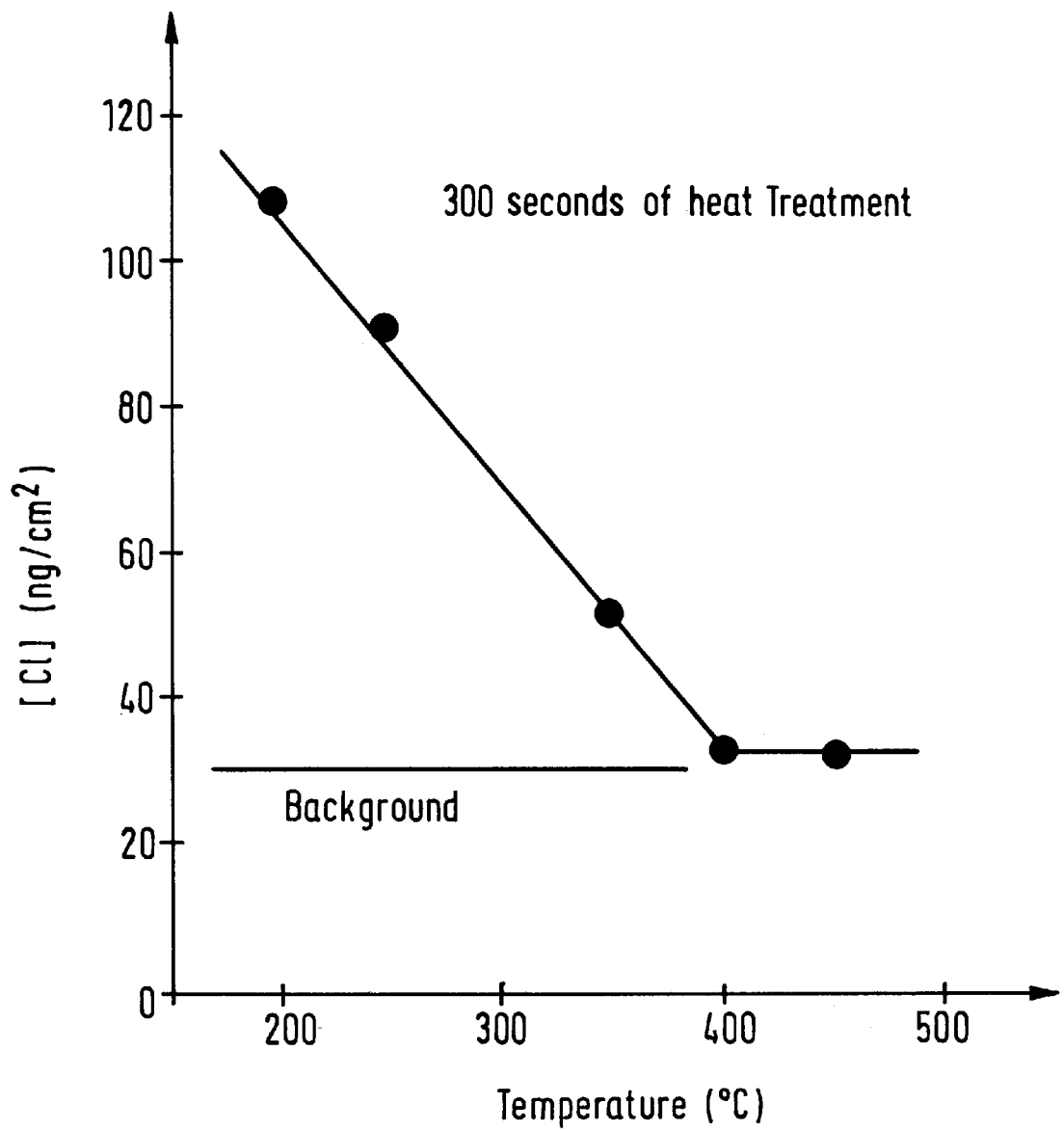
FIG. 3 is the characteristic figure showing relation of anneal temperature and amount of remained chlorine.

Although the amount of remaining Cl decreases linearly to the heat-treatment the temperature of 400° C., it is fixed value when exceeding 400° C. in FIG. 3. It can be understood from the fact that sublimation temperature of AlCl3 is about 370° C. Considering that W grows up well after the heat treatment of 300 degrees or more, if the amount of remained chlorine is less than about 70 ng/cm2, it turns out that good selective CVD can be performed.

However, remaining Cl on SiO2 is also removed in this heat treatment and then the dangling bonds of Si exist on the surface of SiO2. So W grows on the surface. For this reason, by the method indicated by the prior art, W film was not able to be formed with the sufficient selectivity.

Figure 4:
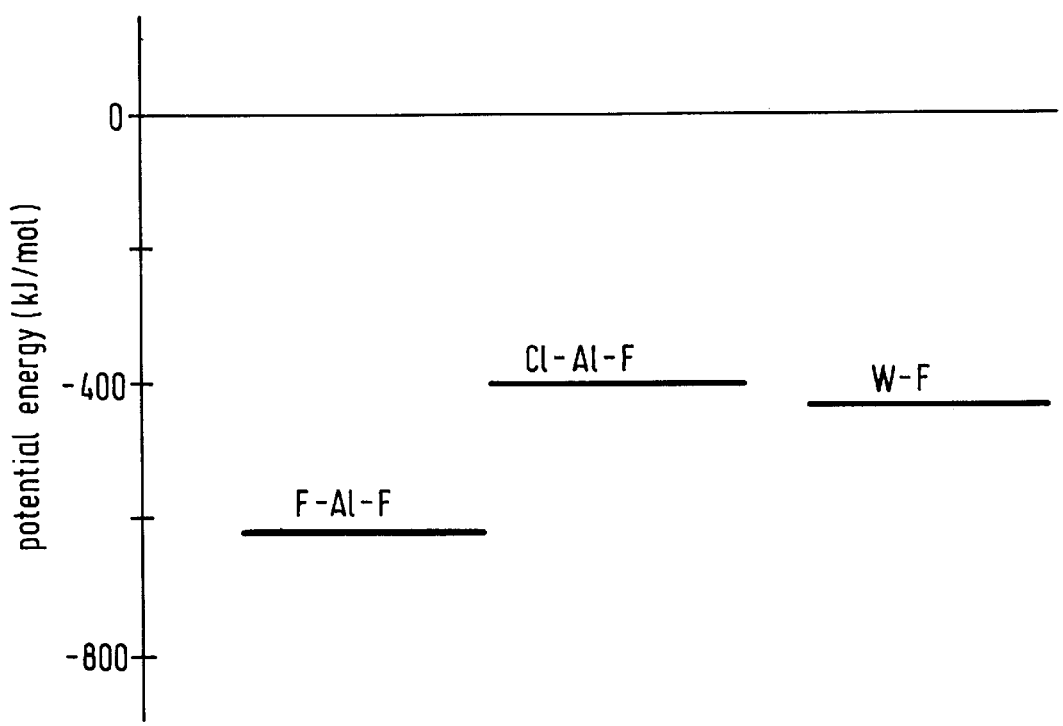
FIG. 4 is the plane outline figure for explaining principle of this invention.

FIG. 4 shows a potential energy on the above systems of Cl—Al—F (x1=Cl, x2=WF6, and M=Al) and F—Al—F (x1=F, x2=WF6, and M=Al) calculated similarly. Since the energy of Cl—Al—F system is larger than the energy of W—F system, much energy is needed so that dissociation-absorption is progressed when Cl remains on the surface of Al. Also since the energy of F—Al—F system is smaller than the energy of W—F system. WF6 spontaneously is absorbed in the surface terminated with F.

Hereafter, with reference to drawings, the preferred embodiments of this invention will be explained.

The inventor performed the following experiment in order to investigate the effect of the pretreatment by two stages according to this invention. Namely, a heat oxide layer with a thickness of 0.1 micrometers all over Si wafer of the diameter of 6 inches is formed and W with a thickness of 0.5 micrometers is formed on the surface of the oxide by introducing WF6 gas and SiH4 gas after carrying out the pretreatment for this heat oxide by various four methods. The number of W particles deposited on the heat oxide was measured with particle counter and the selectivity was evaluated by the following standards.

The number of W particles is 400 or more: A selectivity is bad.

The number of W particles is 100 to 400 : A selectivity is inferior.

The number of W particles is 100 or less: A selectivity is good.

The following four various methods were used as the pretreatment method.

(1) No pretreatment (2) Plasma processing by BCl3→heat-treatment (temperature of 350 degrees)

(3) Sputtering in Ar atmosphere→F2 Processing (4) Sputtering in Ar atmosphere→BCl3 Processing In addition, (4) is a pretreatment concerning this invention. The result is shown in the following.

(1): A selectivity is bad.

(2): A selectivity is inferior.

(3): A selectivity is inferior.

(4): A selectivity is Good

Embodiment 1

Figure 5A:
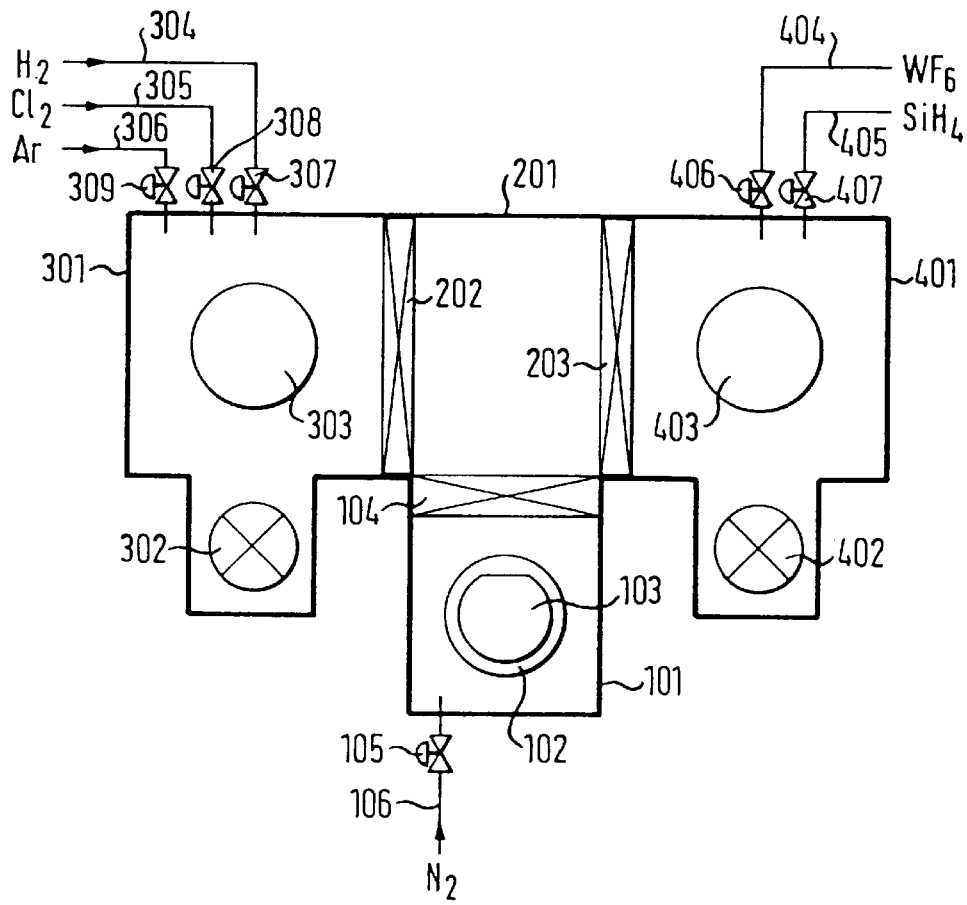
FIG. 5 is the plane outline figure of apparatus used for method of this invention.
Figure 5B:
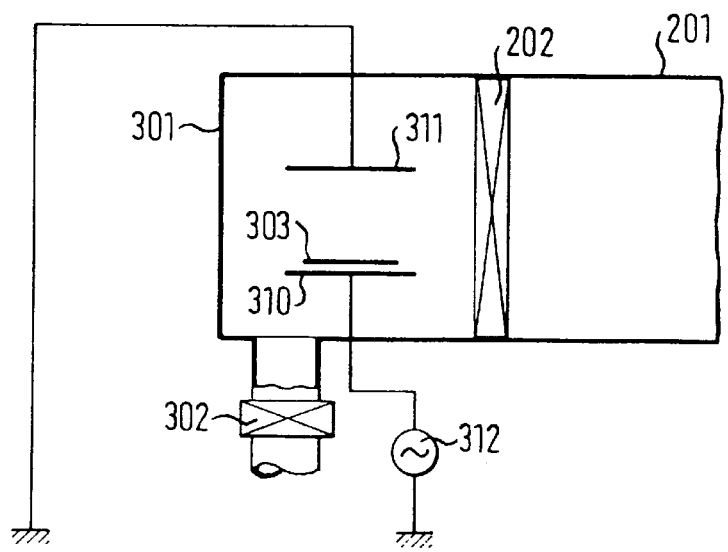

FIG. 5(a) shows an overview of CVD apparatus used for the 1st embodiment of this invention. FIG. 5(b) is a side view of the vacuum chamber 301. This apparatus is constituted from four vacuum chambers 101, 201, 301, and 401. Function of each vacuum chamber is as follows respectively. That is, the vacuum chamber 101 has a role which sets a substrate to a vacuum atmosphere from the atmosphere, the vacuum chamber 201 has a role which conveys the substrate to each vacuum chamber, the vacuum chamber 301 has a role which perform pure processing or cleaning of the substrate before growth of metal film, such as W, and the vacuum chamber 401 has a role which grow up the metal film.

Hereafter, each vacuum chamber of these is precisely explained A turbo molecule pump and a dry pump (not shown in FIG. 5(a)) are connected through gate valves to vacuum chamber 101. The chamber 101 is exhausted by these pumps. The wafer holder 102 for installing a substrate is arranged in the center of the vacuum chamber 101. Moreover, dry N2 supplier (not shown in FIG. 5(a)) which supplies dry N2 in order to control the pressure of low-pressure state to an atmospheric pressure in the vacuum chamber 101 is connected to the vacuum chamber 101 through the stop valve 105.

After flowing dry N2 to the vacuum chamber 101 and setting to an atmospheric pressure, a substrate 103 is put on the wafer holder 102 and the chamber 101 is exhausted to $10^{-4}$ Pa or less using a dry pump and a turbo molecule pump. After an appropriate time, the gate valve 104 which has separated the vacuum chamber 101 and the vacuum chamber 201 is opened, and the substrate 103 is conveyed from the vacuum chamber 101 to the vacuum chambers 201.

The vacuum chamber 201 is equipped with robot arm, and a substrate divides into each vacuum chamber by this robot arm. Moreover, the vacuum chamber 201 is always exhausted to at least $10^{-6}$ Pa with the dry pump and the turbo molecular pump so that the residual gas of the vacuum chambers 101, 301, 401 may not be mutually mixed with each other. After opening the gate valve 104 and conveying the substrate 103 from the vacuum chamber 101 to the vacuum chambers 102, the gate valve 104 is closed, the inside of the vacuum chamber 201 is exhausted again and the pressure in the vacuum chamber 201 is set to $10^{-5}$ Pa or less, a gate valve 202 is opened and the substrate 103 is conveyed in the vacuum chamber 301.

The vacuum chamber 301 is a room for pure processing of the substrate before forming of W, and is exhausted with dry pump and turbo molecular pump (not shown in FIG. 5(a)) which are connected through a gate valve 302. A wafer holder 303 for holding the substrate 103 is arranged in the center mostly of the vacuum chamber 301. The substrate 103 is conveyed from the vacuum chamber 201 and is set on the wafer holder 303.

Gas pipes 304, 305, and 306 for supplying pretreatment gases are connected to the vacuum chamber 301 each other. Each of said gas pipes respectively supplies H2, Cl2, and Ar through the stop valves 306, 307, and 308 shown in FIG. 5(a).

The vacuum chamber 401 is a room for forming a metal film on the substrate 103 and is exhausted with dry pump and turbo molecular pump (not shown in FIG. 5(a)) which are connected through a gate valve 402. An wafer holder 403 having a ceramic heater for holding and heating the substrate 103 is provided in the center of the vacuum chamber 401. The substrate 103 which passes pure processing in the chamber 301, is conveyed through the vacuum chamber 201 to the vacuum chamber 401, and is set on the ceramic heater of the holder 403.

Gas pipes 404 and 405 for supplying material gases are connected to the vacuum chamber 401. Each of said gas pipes respectively supplies WF6 and SiH4 through stop valves 406 and 407.

In the vacuum chamber 301, apparent from FIG. 5(b) a RF electrode 310 connected to 13.56 MHz high frequency power supply 312 and an electrode 311 opposed to the electrode 310 and connected to the ground are arranged.

For pure processing, first, inside of the vacuum chamber 301 is exhausted until the pressure in the vacuum chamber 301 is set to $10^{-5}$ Pa or less.

Next, the valve 309 is opened 100 cc/min of Ar gas is introduced, and the pressure in the vacuum chamber 301 set to 5.0 mPa. When 13.56 MHz of high frequency power voltage is applied between the electrodes 311 and 310 in this state, Ar plasma is generated by electric discharge. The oxide on the surface of the substrate 103 can be removed by the Ar plasma. After such pure processing of the substrate being completed, the introduction of Ar is stopped, and then the valve 308 is opened in order to introduce Cl2 into the chamber 301. At this time, the power voltage is not applied to the electrodes 311 and 310 such that no plasma is generated by electric discharge. Cl is absorbed to the substrate surface by this operation.

Next, the substrate 103 is transported to the vacuum chamber 401 and is set on the ceramic heater 403. The ceramic heater is regulated so that a substrate temperature is set to 220 degrees. Then, the stop valve 406, 407 are opened, 20 cc,/min of WF6 and 14 cc/min of SiH4 is introduced in the chamber 401 for 3 minutes. At this time, tungsten (W) film with a thickness of about 1.2 micrometers is formed in the selected regions of the substrate 103.

The selective formation process of W film is explained with reference to FIG. 6.

FIG. 6 is sectional views explaining the selective formation process of W film according to the embodiment of the present invention.

First, as is shown in FIG. 6(a), SiO2 film 501 is formed with thickness of 100 nm on the Si substrate 103. Subsequently, Al—Si—Cu film 502 is formed with thickness of 400 nm on the SiO2 film 501 by sputtering, and is patterned into the desired wiring pattern with use of usual optical exposing method and reactive ion etching.

Next, film 503 is deposited with thickness of 1.4 micrometers by TEOS-O2 plasma on the SiO2 film 501 and the Al—Si—Cu film 502. A contact hole 504 for obtaining electric connection to the Al—Si—Cu wiring 502 is formed in the desired position of the SiO2 film 503 with use of optical exposing method and reactive ion etching. The reactive ion etching for SiO2 film 503 is performed using etching species of a fluorine system.

So-called pollution layer 505 exists in the bottom of the contact hole and on the surface of the Al—Si—Cu wiring 502 after opening the contact. This pollution layer 505 consists of fluorocarbon film which is reaction object of a resist and fluorine (F), RIE damage layer which is formed by F ions and O ions implantation, or oxide layer produced from oxygen plasma used for ashing of a resist.

Thus, even if W film is formed in the bottom of contact hole in the state where such damage layer 505 exists, the W film can not selectively be formed.

In the embodiment of the present invention, to remove the damage layer 505, first, the substrate 103 is set on the wafer holder 102 in the vacuum chamber 101 shown in FIG. 5. Inside of the vacuum chamber 101 is exhausted to set the vacuum pressure $5 \times 10^{-4}$ Pa or more. The gate valve 104, then, is opened and the substrate 103 is conveyed in the vacuum chamber 201. Subsequently, the gate valve 104 is closed and the inside of the vacuum chamber 102 is exhausted further. When the vacuum pressure in the vacuum chamber 102 become $10^{-9}$ Pa or more, the gate valve 202 is opened and the substrate 103 is conveyed in the vacuum chamber 301 to set on the wafer holder 303.

Next, the stop valve 309 is opened, and 100 cc/min of Ar gas is introduced, and pressure in the vacuum chamber 301 is set to 5 mPa. In such state, 13.56 MHz and 50 to 150 Watt of high frequency power voltage is applied to the electrode 310 for 10 to 60 seconds. Ar plasma is formed between the electrodes 310, 311 and Ar+ ion is pulled to the wafer holder 303 which is a negative electrode side (shown in FIG. 6(b)). Ar+ ion obtaining electric energy collides with the substrate surface and etches the surface. The damage layer 50 existing in the bottom of contact hole is also etched (FIG. 6(c)).

However, since Ar sputtering is an operation physical etching, of Si exist on the surface of the silicon oxide 503. Al—Si—Cu surface of the bottom of the contact hole does not have such active combination because it is a metal film (FIG. 6(c)).

Then, after stopping application of the high frequency voltage between the electrodes and supply of Ar gas, the stop valve 305 is opened and 100 cc/min of Cl2 gas is introduced in the vacuum chamber 301 to be set 0.8 Pa. At this time, An electric discharge of Cl2 is not performed. This operation is performed for 30 to 60 seconds. By this operation, Cl atom or Cl2 molecule is absorbed on the surface of the silicon oxide 103. Especially chlorine is absorbed to the dangling bond of Si firmly, and the dangling bonds are terminated by chlorine. Although chlorine is also absorbed to the Al—Si—Cu surface of the bottom of the contact hole, most of them are just physically absorbed with weak termination by chlorine in the room temperature (FIG. 6(*d*)).

The substrate 103 of such state is conveyed in the vacuum chamber 401 through the vacuum chamber 201 from the vacuum chamber 301, to be put on the ceramic heater 402 in the vacuum chamber 401. The substrate is stabilized to a desired temperature in predetermined time. For example, after setting the substrate 103 into 220 degrees, the stop valves 406, 407 are opened and 20 cc/min of WF6 and 14 cc/min of silane (SiH4) are introduced for 3 minutes (FIG. 6(*e*)).

Then, the supply of WF6 and SiH4 and the inside of the vacuum chamber 401 is exhausted. When the pressure in the vacuum chamber 201 is set to about $5 \times 10^{-6}$ Pa or less, the gate valve 203 is opened, and the substrate 103 is conveyed in the vacuum chamber 201. And then, when the pressure in the vacuum chamber 201 is further set to $5 \times 10^{-9}$ Pa or less, the gate valve 104 is opened, the substrate 103 is conveyed in the vacuum chamber 101, to set on the wafer holder 103. In such state, while closing the gate valve of the exhaust system which is exhausting the vacuum chamber 101, the valve 105 is opened, dry N2 is introduced in the vacuum chamber 101, the inside of the chamber 101 is set returned to an atmospheric pressure, and the substrate 103 is took out to the outside of the chamber 101. When this substrate 103 is observed by SEM, W film was formed with the sufficient selectivity at the thickness of 1.2 micrometers in the contact hole.

Next, after further forming the Al—Si—Cu film on the substrate 103 that W film is formed and patterning the Al—Si—Cu film, electrical property was measured. The result is shown in FIG. 7.

Figure 7:
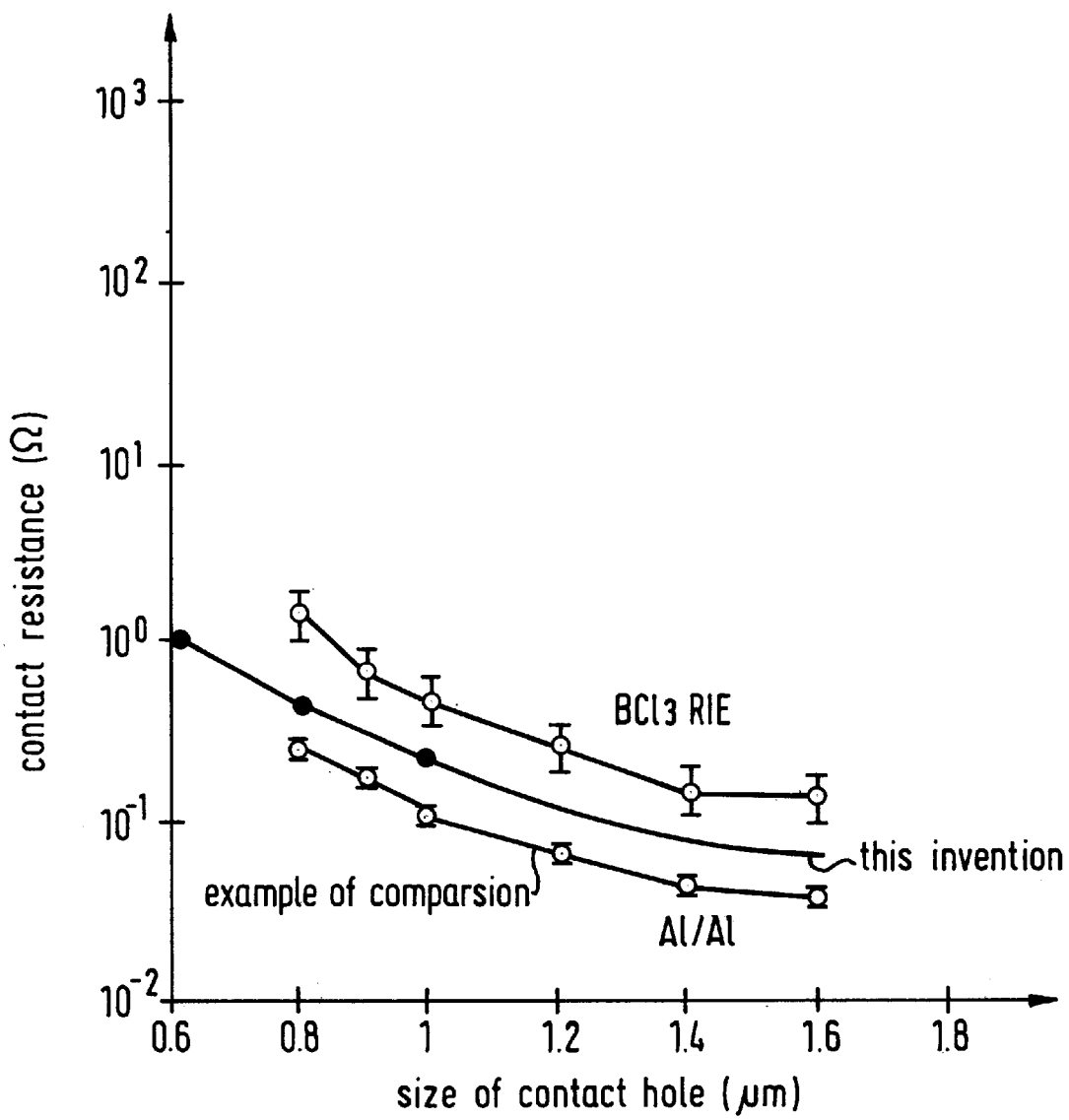
FIG. 7 is the characteristic figure showing contact size dependability of contact resistance which shows effect of the 1st Example of this invention.
Figure 9A:
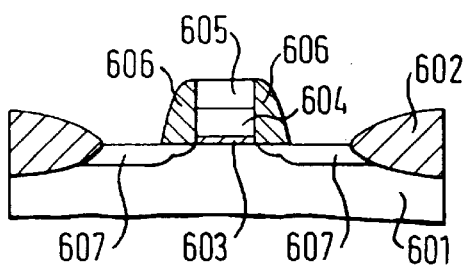
FIG. 9 is the sectional view showing selective formation process of W film concerning the 2nd Example of this invention.
Figure 9B:
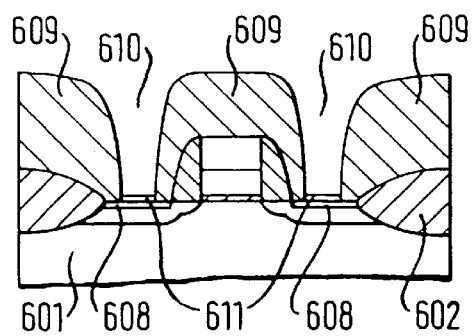
Figure 9C:
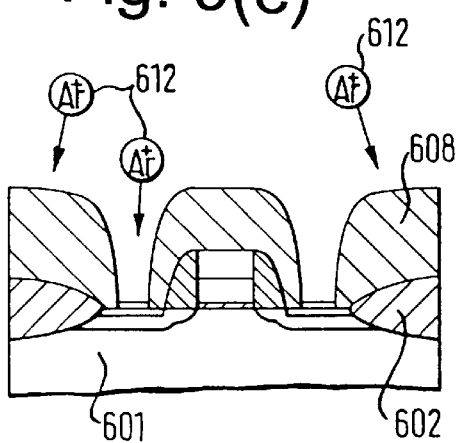
Figure 9D:
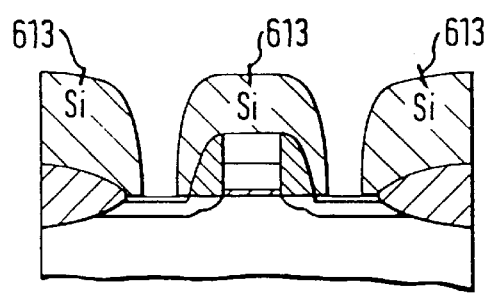
Figure 9E:
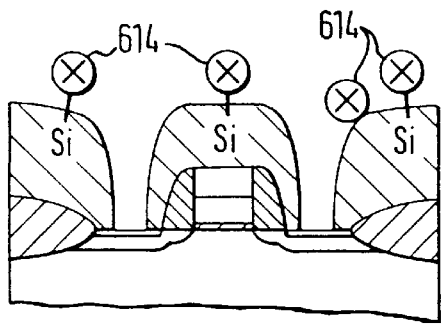
Figure 9F:
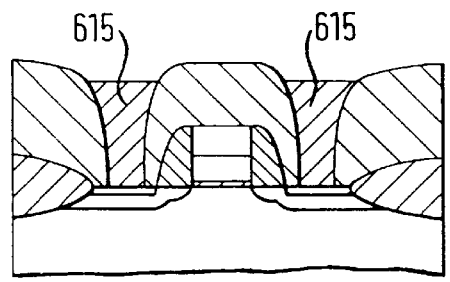

FIG. 7 shows dependability of contact resistance of W/Al-1% Si-0.5% Cu structure to the size of contact hole. The depth of the contact hole is 0.6 micrometers, and it enabled it to measure the contact characteristic certainly also with Al—Si—Cu/Al—Si—Cu structure not embedded by W used as the example of comparison where it has ideal resistance value. As shown in FIG. 7, the contact resistance of W/Al—Si—Cu structure is about 1.2 times of the example of comparison.

FIG. 8 shows electrical short yield between Al wires where Al wire being formed on W completely formed in 0.5-micrometer width of contact hole. According to the method of this invention, short yield is remarkably improved compared with the method (example of comparison) of the prior art. This is considerably because the generating of W grains on the insulating film being controlled.

Embodiment 2

The 2nd embodiment of this invention is explained with reference to FIG. 9.

Isolation for devices on a silicon (Si) substrate 601 is performed by usual LOCOS (Local Oxidation of Silicon) method. Numeral 602 shows a field isolation film formed by LOCOS. After forming a gate insulating layer 603 on the silicon substrate 601, a polysilicon layer 604 and a tungsten silicide (WSix) layer 605 are deposited and patterned. The gate electrode, thus, is formed.

Then, N− ion implantation is performed to the silicon substrate 601 with use of the gate electrode as a mask, and N− diffusion layer is formed at the surface of the silicon substrate 601. Next, a side wall 605 consisting of SiO2 is formed on the side of the gate electrode. The gate electrode and the side wall 605 as a mask are used for a next ion implantation performed to the silicon substrate 601. Thereby, N+ diffusion layer 607 is formed at the surface of the silicon substrate 601 (FIG. 9(*a*)).

Then, after forming TiN—Ti by sputtering, the substrate 601 is heat-treated in nitrogen (N2) atmosphere for 30 minutes by 600 degrees. By this heat treatment, Ti and Si on the surface of the substrate 601 react with each other. And further, while TiN and unreacted Ti are removed by processing with mixed solution of H2SO4-H2O2, the TiSi2 layer 608 is remained only on the diffusion layer 607. The SiO2 film 609 is deposited with thickness of 1.4 micrometers.

Then, a contact hole 610 for obtaining an electric connection is formed in a desired position of the SiO2 film 609 with use of optical exposing method and reactive ion etching. The reactive ion etching for SiO2 film 609 is performed using the etching species of a fluorine system. So-called pollution layer or damage layer 611 exists in the bottom of the contact hole (FIG. 9(*b*)). Even if W film is formed in the state where such pollution layer 611 exists, the W film can not selectively be formed only in the (contact hole.

The substrate 601 having the contact hole 610 is set on the wafer holder 303 of the apparatus was shown in FIG. 5. Next, the stop valve 309 is opened and 100 cc/min of Ar gas is introduced. Pressure in the vacuum chamber 301 is set to 5 mPa, 13.56 MHz and 50 to 150 Watt of high frequency power voltage is applied to the electrode 310 for 10 to 60 seconds.

Thereby Ar plasma is generated between the electrodes 310, 311. Ar+ is pulled to the wafer holder 303 which is a negative side of the electrode 310. Ar+ ion obtaining electric energy collides with the surface of the substrate and etches the surface. The damage layer 611 existing in the bottom of contact hole 610 is also etched (FIG. 9(*c*)).

A number of active dangling bond 612 by Si exist on the surface of the silicon oxide 609 (FIG. 9(*d*)). TiSi2 surface of the bottom of the contact hole 610 does not have such an active dangling bond because it is a metal film.

After stopping application of high frequency voltage between the electrodes 310, 311 and introduction of Ar gas, the substrate temperature is heated down into room temperature. Then, 100 cc/mm of Cl2 is introduced in the vacuum chamber 301 to set to 0.8 Pa. At this time, an electric discharge of Cl2 is not performed. This operation is performed for 30 to 60 seconds. By this operation, chlorine (Cl) atoms or Cl2 molecules are absorbed on the surface of the silicon oxide 609. Especially chlorine atoms are absorbed to the dangling bond 612 of Si firmly, and the dangling bonds 612 are terminated. Although chlorine atoms are absorbed to the TiSi2 surface of bottom of the contact hole, most of them are just physically absorbed with weak termination by chlorine in the room temperature (FIG. 9(*c*)).

The substrate 601 of such state is conveyed in the vacuum chamber 401 through the vacuum chamber 201 from the vacuum chamber 301 to be put on the ceramic heater 402 in the vacuum chamber 401.

After setting the temperature of the substrate 601 into 220 degrees, for example, the stop valves 406,407 are opened and 14 cc/mm of silane (SiH4) and 20 cc/mm of WF6 are introduced into the chamber 401 for about 4 minutes.

Then, the introduction of WF6 and SiH4 is stopped and the inside of the vacuum chamber 401 is exhausted. When pressure in the vacuum chamber 201 is set to $5 \times 10^{-9}$ Pa or less and the gate valve 104 is opened, the substrate 601 is conveyed in the vacuum chamber 101. And then, when the pressure in the vacuum chamber 101 is further set to $5\times10^{-6}$ Pa or less and the gate valve 203 is opened, the substrate 601 is conveyed in the vacuum chamber 201 to set on the wafer holder 103.

In such state, while closing the gate valve 104 of the exhaust system which exhausts inside of the vacuum chamber 101, the valve 105 is opened and dry N2 is introduced in the vacuum chamber 101. The inside of the chamber 101 is set to an atmospheric pressure, and the substrate 601 is took out to the outside of the chamber 101.

When this substrate 601 is observed by using SEM, W film having 1.4 micrometers of thickness is formed with a sufficient selectivity in the contact hole. Next, after further forming Al—Si—Cu film on the substrate 601 which W film is formed and patterning the Al—Si—Cu film, electrical property is measured. The result is shown in FIG. 10.

Figure 10:
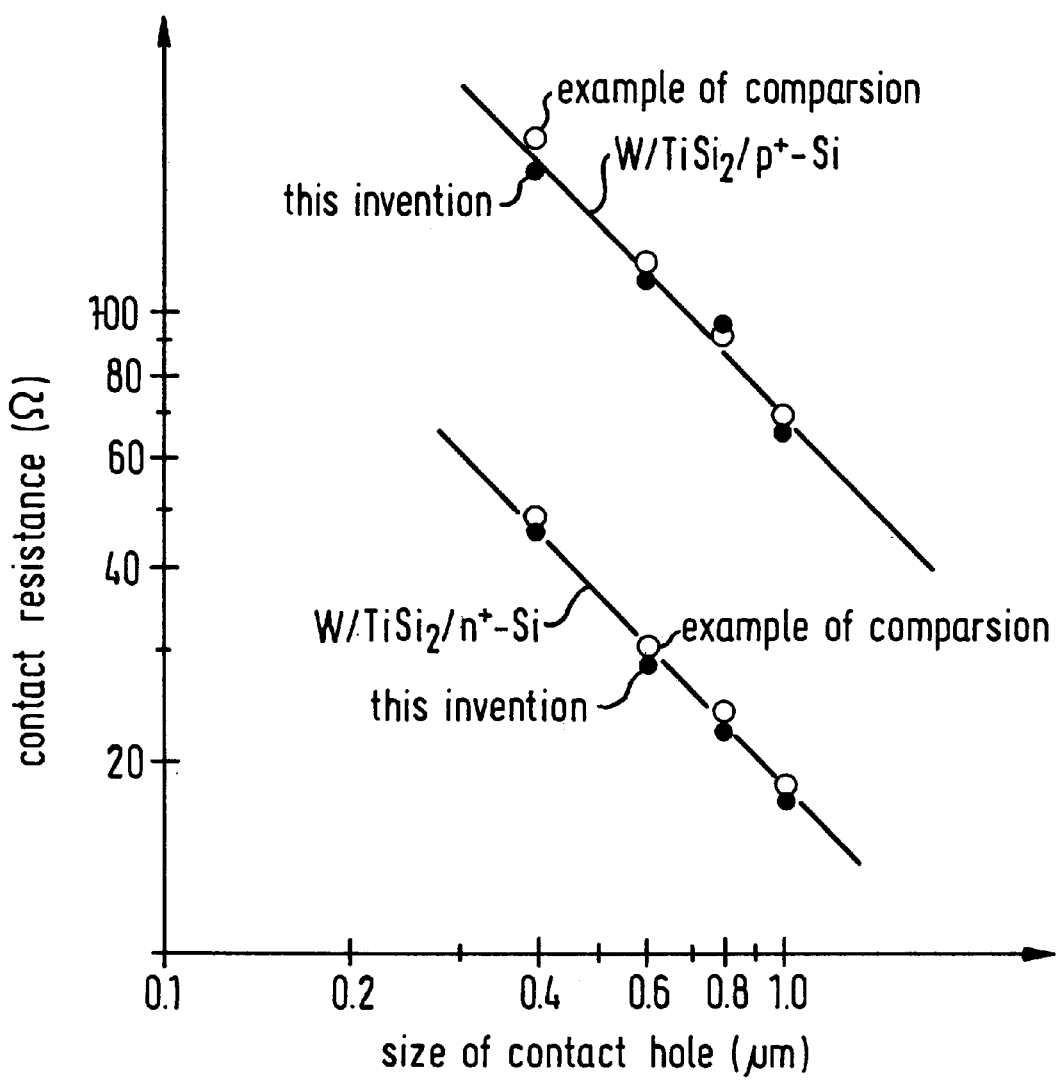
FIG. 10 is the characteristic figure showing contact size dependability of contact resistance which shows effect of the 2nd Example of this invention

FIG. 10 shows dependability of contact resistance of W/TiSi2/N$^+$—Si structure and W/TiSi2/P$^+$—Si structure to the size of contact hole. The depth of the contact hole is 0.6 micrometers, and it enabled it to measure the contact characteristic certainly also with the structure not embedded by W used as the example of comparison. In this case, the contact resistance of W/Al—Si—Cu structure is about the same as the contact resistance of an Al/TiN/N$^+$—Si structure which is an example of comparison. As shown in FIG. 10, according to the method of the invention, a stable characteristic can be obtained.

Figure 11:
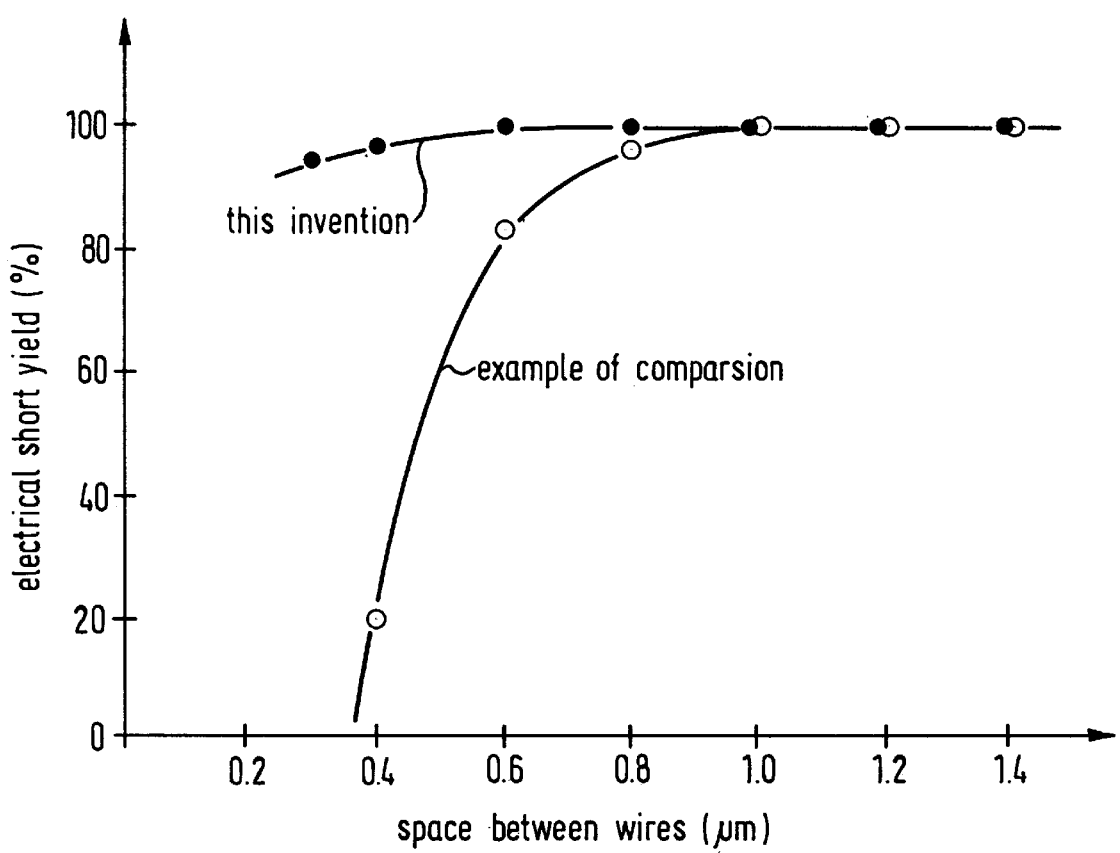
FIG. 11 is the characteristic figure showing wiring short yield of 1st layer Al which shows effect of the 2nd Example of this invention.

FIG. 11 shows electrical short yield between Al wires which are formed on W completely and selectively formed in 0.5 micrometer width of contact hole. According to the method of this invention, short yield is remarkably improved compared with the method (example of comparison) of the prior art 3. This is considerably because the generating of W grains on the insulating film is controlled.

Although plasma by introducing Ar is generated in the above embodiment 2, there is an effect of removing the pollution layer or the damage layer 611 similarly even when H2 (hydrogen) is used instead of Ar. For example, 10 to 200 cc/mm of hydrogen gas is introduced and the pressure in the vacuum chamber 301 is set to 0.1 to 1.0 Pa, and 13.56 MHz and 50 to 150 Watt of high frequency power voltage is applied to the electrode of the wafer holder side for 10 to 60 seconds. In this operation H$^+$ ions are formed within plasma and hydrogen radicals etch the damage layer 611 chemically.

In addition, the SiO2 surface is also etched as same as the previous embodiment, since many dangling bonds are formed in the surface of the substrate. Therefore, to obtain a selectivity of W formation the substrate must be processed in the atmosphere including the halogen atom as explained in previous embodiment.

Embodiment 3

Figure 12:
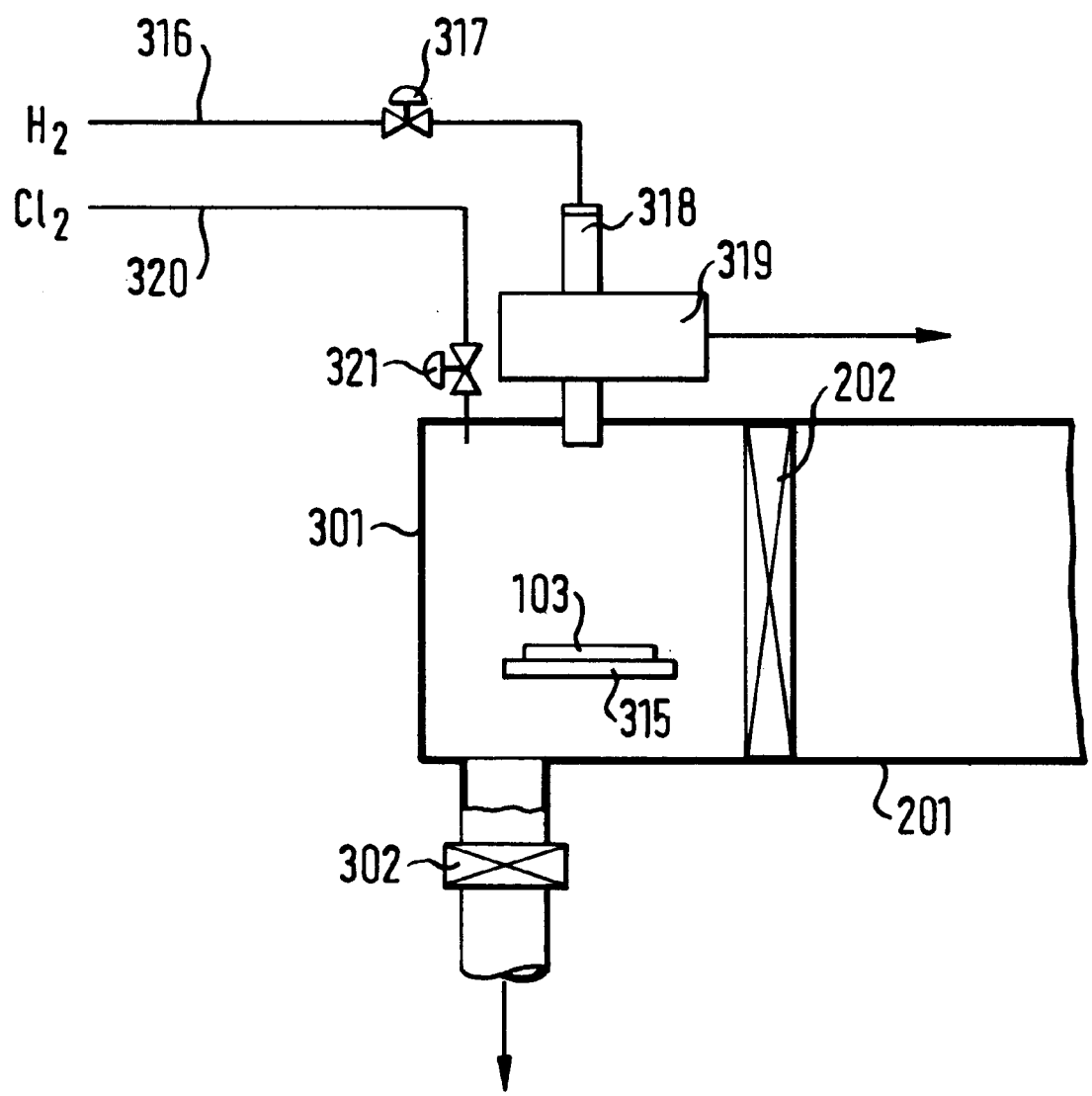
FIG. 12 is the partial outline figure of apparatus used in the 3rd Example of this invention.
Figure 13A:
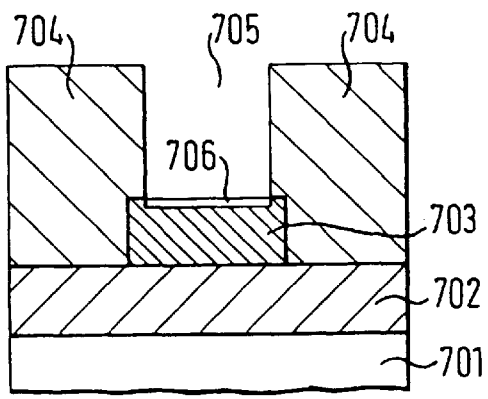
FIG. 13 is the sectional view showing selective formation process of W film concerning the 3rd Example of this invention.
Figure 13B:
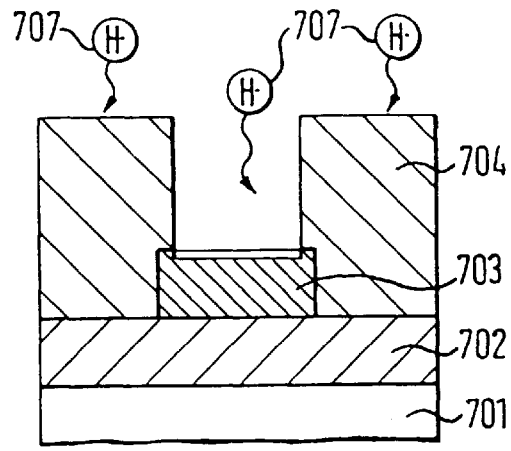
Figure 13C:
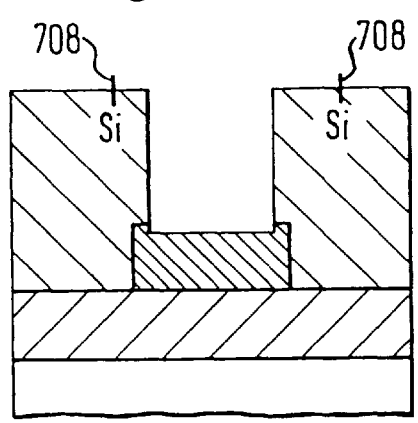
Figure 13D:
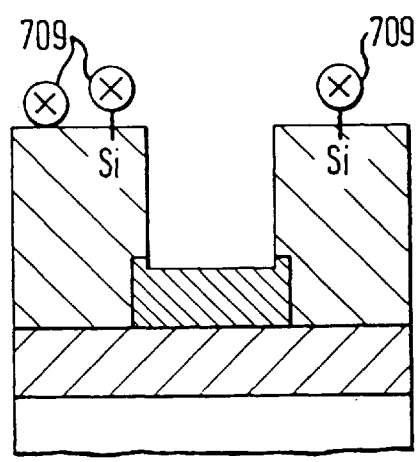
Figure 13E:
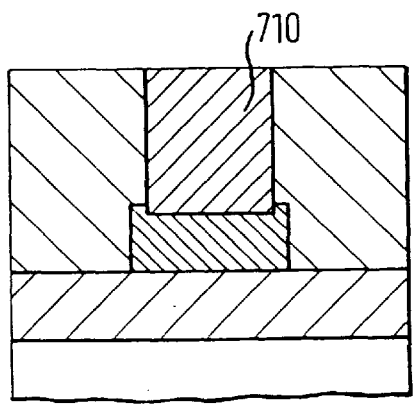

In this embodiment, hydrogen gas plasma instead of inactive gas plasma is used. FIG. 12 shows a chamber which modifies the vacuum chamber 301 shown in FIG. 5(b) so that hydrogen radical could be formed by microwave electric discharge of hydrogen gas.

A dry pump and a turbo molecule pump (not shown in FIG. 12) are connected through gate valve 302 to the vacuum chamber 301. The vacuum chamber 301 is exhausted by these pumps. A wafer holder 315 for holding a substrate is arranged in the center of the vacuum chamber 301, and the substrate 103 conveyed from the vacuum chamber 201 is set on the wafer holder 315. Gas pipes for supplying pretreatment gases are connected to the vacuum chamber 301.

Gas pipes 316 and 320 are connected to the vacuum chamber 301. Each of said gas pipes respectively supplies H2 and Cl2 through the stop valves 317 and 321. The gas pipe 316 supplying H2 to the vacuum chamber 301 is connected to the pipe 318 made of Al2O3, and the resonance pipe 319 for supplying microwave electric power to H2 gas is provided at the pipe 318. A microwave power supply is not shown in FIG. 12.

The substrate 103 is conveyed from the vacuum chamber 201 and set on the wafer holder 315 in the vacuum chamber 301. In such state, H2 gas for processing is introduced and plasma is generated by application of high frequency voltage to the resonance pipe 319 connected to high frequency power of 13.56 MHz. And the substrate surface is processed by H2 radical generated from the plasma.

FIG. 13 is sectional views explaining the selective formation process of W film according to the embodiment 3 of the present invention. The used sample is the same as that of 1st embodiment. Silicon (Si) substrate 701, oxide film 702, Al—Si—Cu film 703, and plasma SiO2 film 704, contact hole 705, and pollution layer 706 are formed similar to the 1st embodiment shown in FIG. 1 (FIG. 13(a)).

First, the substrate 701 is set on the wafer holder 102 in the vacuum chamber 101 shown in FIG. 5. And the substrate 701 is conveyed in the vacuum chamber 301 via the vacuum chamber 101, 102 and is set on the wafer holder 315 in the vacuum chamber 301. Subsequently, inside of the vacuum chamber 301 is exhausted to set the vacuum pressure $1\times10^{-5}$ Pa or less. Next a valve 317 is opened and 100 cc/min of H2 is introduced and pressure in the vacuum chamber 301 is set to 5.0 mPa. When 50 to 150 Watt and 13.56 MHz of the high frequency voltage is applied at the resonance pipe 319 in this state, electric discharge is caused and hydrogen plasma is generated. Hydrogen radicals formed by this hydrogen plasma are conveyed to the substrate surface and etched the oxide film on the substrate surface (FIG. 13(b)). After etching by the hydrogen plasma for 10 to 60 seconds, the pollution layer 706 on the Al—Si—Cu film 703 is removed completely (FIG. 13(c)). Then, after H2 introduction is stopped, a valve 321 is opened and 100 cc/min of Cl2 is introduced. Pressure in the vacuum chamber 301 is set to 0.8 Pa. At this time, electric discharge of Cl2 is not performed. This operation is performed for 30 to 60 seconds. By this operation, Cl atom or Cl2 molecule is absorbed on the surface of the silicon oxide (FIG. 13(c)).

Especially chlorine is absorbed to the dangling bond of Si firmly, and the dangling bonds are terminated by chlorine. Although chlorine is absorbed to the Al—Si—Cu surface of the bottom of the contact hole, most of them are just physically absorbed with weak termination by chlorine in the room temperature (FIG. 13(d)).

The substrate 701 of such state is conveyed in the vacuum chamber 401 through the vacuum chamber 201 from the vacuum chamber 301 to be put on the ceramic heater 402 in the vacuum chamber 401. The substrate is stabilized to a desired temperature in predetermined time. For example, after setting the temperature of the substrate into 220 degrees, the stop valves 406, 407 are opened and 20 cc/mm of WF6 and 14 cc/mm of silane (SiH4) are introduced for 3 minutes.

Then, the supply of WF6 and SiH4 is stopped and the inside of the vacuum chamber 401 is exhausted. When the pressure in the vacuum chamber 201 is set to $5\times10^{-9}$ Pa or less, the gate valve 104 is opened, the substrate 701 is conveyed in the vacuum chamber 101. And then, when the pressure in the vacuum chamber 101 is further set to $5\times10^{-6}$ Pa or less, the gate valve 203 is opened, the substrate 701 is conveyed in the vacuum chamber 201 to set on the wafer holder 103.

In such state, while closing the gate valve of the exhaust system which exhausts the vacuum chamber 101, the valve 105 is opened, dry N2 is introduced in the vacuum chamber 101, the inside of the chamber 101 is set to an atmospheric pressure, and the substrate 701 is took out to the outside of the chamber 101.

When this substrate 701 is observed by SEM, W film is formed with the sufficient selectivity at thickness of 1.2 micrometers in the contact hole. Moreover, after forming and patterning of Al—Si—Cu film on the substrate formed similarly, the electrical property is measured. A stable characteristic of the electric property can be obtained. Moreover, short yield can be remarkably improved. This is considerably because the generating of W grains on the insulating film is controlled or decreased.

Embodiment 4

In this embodiment, of hydrogen gas plasma instead of inactive gas plasma is used. For performing the process of the embodiment 4, a similar apparatus explained in the embodiment 3 can be used.

FIG. 14 is sectional views explaining the selective formation process of W film according to the embodiment 4 of the present invention.

An oxide film 803 which has a contact hole 804 is formed on a silicon (Si) substrate 801. A diffusion layer 802 is formed at the surface of the substrate 801 where the contact hole 804 is exposed. And a TiSi2 layer 805 is formed at the surface of the diffusion layer 802. A pollution layer 806 produced at the last process exists in the surface of layer TiSi2 805 (FIG. 14(a)).

First, the substrate 801 is set on the wafer holder 102 in the vacuum chamber 101 shown in FIG. 5. And the substrate 801 is conveyed in the vacuum chamber 301 via the vacuum chamber 101, 102 and is set on the wafer holder 315 in the vacuum chamber 301. Subsequently, inside of the vacuum chamber 301 is exhausted to set the vacuum pressure $1 \times 10^{-5}$ Pa or less. Next a valve 317 is opened and 100 cc/min of H2 is introduced and pressure in the vacuum chamber 301 is set to 5.0 mPa. When 50 to 150 Watt and 13.56 MHz of the high frequency voltage is applied at the resonance pipe 319 in this state, electric discharge is caused and hydrogen plasma is generated. Hydrogen radicals generated by this hydrogen plasma are conveyed to the substrate surface and the oxide film on the substrate surface is etched (FIG. 14(b)).

Figure 14A:
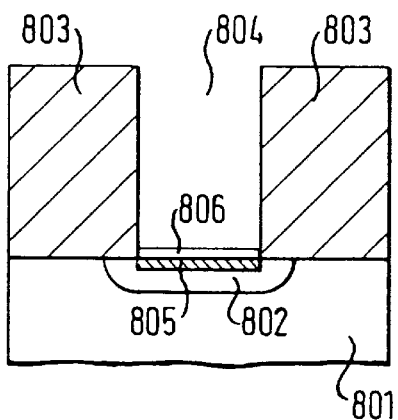
FIG. 14 is the sectional view showing selective formation process of W film concerning the 4th Example of this invention.
Figure 14B:
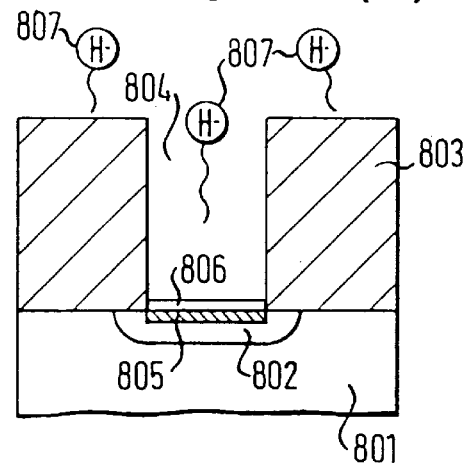
Figure 14C:
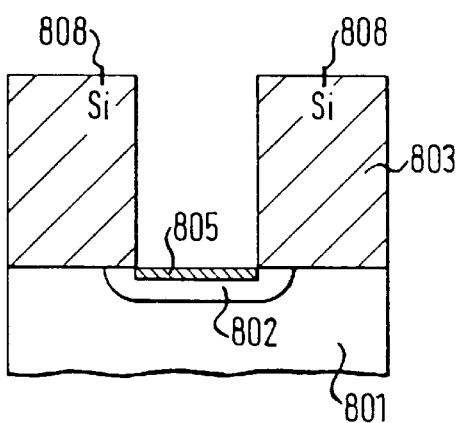
Figure 14D:
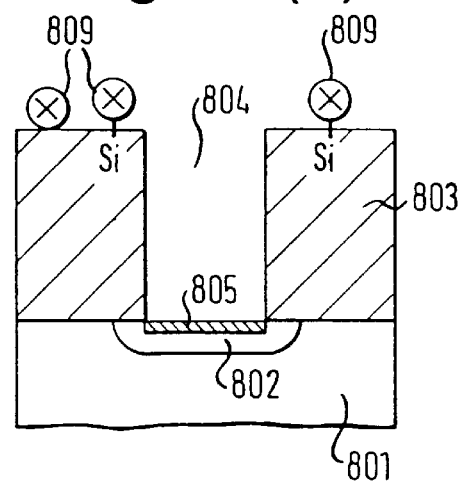
Figure 14E:
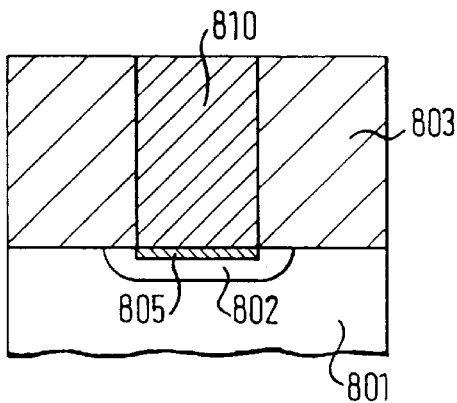

After etching by the hydrogen plasma for 10 to 60 seconds, the pollution layer 806 on the Al—Si—Cu film 803 is removed completely (FIG. 14(c)). Then, H2 introduction is stopped, a valve 321 is opened, and 100 cc/min of Cl2 is introduced. Pressure in the vacuum chamber 301 is set to 0.8 Pa. At this time, electric discharge of Cl2 is not perform. This operation is performed for 30 to 60 seconds. By this operation, Cl atom or Cl2 molecule is absorbed on the surface of the silicon oxide (FIG. 14(c)).

Especially chlorine is absorbed to the dangling bond of Si firmly, and the dangling bonds are terminated by chlorine. Although chlorine is absorbed to the Al—Si—Cu surface of the bottom of the contact hole, most of them are just physically absorbed with weak termination by chlorine in the room temperature (FIG. 14(d)).

The substrate 801 of such state is conveyed in the vacuum chamber 401 through the vacuum chamber 201 from the vacuum chamber 301 to be put on the ceramic heater 402 in the vacuum chamber 401. The substrate is stabilized to a desired temperature in predetermined time. For example, after setting the temperature of the substrate 701 into 220 degrees, the stop valves 406,407 are opened and 20 cc/mm of WF6 and 14 cc/mm of silane (SiH4) are introduced for 3 minutes.

Then, the supply of WF6 and SiH4 is stopped and the inside of the vacuum chamber 401 is exhausted. When the pressure in the vacuum chamber 201 is set to $5 \times 10^{-9}$ Pa or less, the gate valve 104 is opened, the substrate 801 is conveyed in the vacuum chamber 101. And then, when the pressure in the vacuum chamber 101 is further set to $5 \times 10^{-6}$ Pa or less, the gate valve 203 is opened, the substrate 701 is conveyed in the vacuum chamber 201 to set on the wafer holder 103.

In such state, while closing the gate valve of the exhaust system which exhausts the vacuum chamber 101, the valve 105 is opened, dry N2 is introduced in the vacuum chamber 101, the inside of the chamber 101 is set to an atmospheric pressure, and the substrate 801 is took out to the outside of the chamber 101.

When this substrate 801 is observed by SEM, W film is formed with the sufficient selectivity at thickness of 1.2 micrometers in the contact hole. Moreover, after forming and patterning of Al—Si—Cu film on the substrate formed similarly, the electrical property is measured. A stable characteristic of the electric property can be obtained. Moreover, short yield can be remarkably improved. This is considerably because the generating of W grains on the insulating film is controlled or decreased.

According to the methods of this invention as explained above, the pretreatment of two steps comprises exposing a substrate to plasma atmosphere of inactive gas or hydrogen gas and subsequently exposing to gas atmosphere which contains halogen atom except fluorine. By these two steps of pretreatment, a metal film is selectively formed in the bottom of opening formed in an insulating film.

What is claimed is:

1. A method of selectively depositing a metal film in an opening of an insulating layer formed on a semiconductor substrate, the opening exposing a surface of at least one of a metal layer, a semiconductor layer, and the semiconductor substrate, the method sequentially comprising the steps of:

first, exposing a surface of the insulating layer and the surface exposed by the opening to a gas plasma consisting of an inert gas or hydrogen;

second, exposing the insulating layer to a non-plasma gas containing halogen atoms other than fluorine atoms; and third, selectively depositing a metal film in the opening of the insulating layer.

2. The method according to claim 1, wherein said gas containing halogen atoms other than fluorine atoms is at least one selected from the group consisting of $Cl_2$, $BCl_3$, HCl and $CCl_4$.

3. The method according to claim 1, wherein the step of exposing a semiconductor substrate in the gas plasma and in the gas containing halogen atoms except fluorine atoms are performed in a vacuum chamber.

4. The method according to claim 1, wherein said metal film is at least one selected from the group consisting of W, Ti, Mo and Cu.

5. The method according to claim 1, wherein said inert gas is at least one of Ar and He.

6. The method according to claim 1, wherein the step of exposing the semiconductor substrate in the gas containing halogen atoms other than fluorine atoms is performed at the substrate temperature −30 to 60 degrees Celsius.

7. The method according to claim 1, wherein the step of exposing the semiconductor substrate in the gas containing halogen atoms other than fluorine atoms is performed at the substrate temperature 10 to 30 degrees Celsius.

8. The method according to claim 1,
wherein the step of depositing a metal film is performed at the substrate temperature 180 to 260 degrees Celsius.

9. The method according to claim 1,
wherein the step of depositing a metal film is performed at the substrate temperature 200 to 220 degrees Celsius.

* * * * *